(12) United States Patent
Yang et al.

(10) Patent No.: US 12,200,424 B1
(45) Date of Patent: *Jan. 14, 2025

(54) CAPACITIVE TOUCH SENSING USING SYSTEM-IN-PACKAGE COMPONENTS AND BATTERIES

(71) Applicant: Amazon Technologies, Inc., Seattle, WA (US)

(72) Inventors: Chaoran Yang, Shenzhen (CN); Binbin Yang, Suzhou (CN); Xin Zhao, Suzhou (CN); Lei Wang, Zhuhai (CN); Fubin Song, Hong Kong (CN)

(73) Assignee: Amazon Technologies, Inc., Seattle, WA (US)

( * ) Notice: Subject to any disclaimer, the term of this patent is extended or adjusted under 35 U.S.C. 154(b) by 357 days.

This patent is subject to a terminal disclaimer.

(21) Appl. No.: 17/567,416

(22) Filed: Jan. 3, 2022

(51) Int. Cl.
*H04R 1/10* (2006.01)
*H04R 25/00* (2006.01)
*H05K 1/18* (2006.01)

(52) U.S. Cl.
CPC ......... *H04R 1/1041* (2013.01); *H04R 1/1016* (2013.01); *H04R 25/554* (2013.01); *H05K 1/182* (2013.01); *H05K 1/189* (2013.01); *H04R 2225/49* (2013.01); *H04R 2225/51* (2013.01); *H05K 2201/10098* (2013.01)

(58) Field of Classification Search
CPC .. H04R 1/1016; H04R 1/1041; H04R 25/554; H04R 2225/49; H04R 2225/51; H01Q 1/272; H05K 1/182; H05K 1/189; H05K 2201/10098
See application file for complete search history.

(56) References Cited

U.S. PATENT DOCUMENTS

| | | | |
|---|---|---|---|
| 10,827,249 B1* | 11/2020 | Pine | H04R 1/1041 |
| 11,372,506 B1* | 6/2022 | Song | H03K 17/9622 |
| 11,775,119 B1* | 10/2023 | Song | H01L 25/0655 |
| | | | 361/749 |
| 2019/0261100 A1* | 8/2019 | Troelsen | H04R 25/60 |

* cited by examiner

*Primary Examiner* — Huyen D Le
(74) *Attorney, Agent, or Firm* — Eversheds Sutherland (US) LLP

(57) ABSTRACT

Systems, methods, and computer-readable media are disclosed for capacitive touch sensing using system-in-package components and batteries. In one embodiment, a device may include a flexible printed circuit, a button cell electrically coupled to the flexible printed circuit, and a system-in-package that is electrically coupled to the flexible printed circuit. The system-in-package may include an electromagnetic interference shield, and a capacitive touch sensor. The capacitive touch sensor may be configured to detect a change in capacitance via a change in electric field at the electromagnetic interference shield.

20 Claims, 7 Drawing Sheets

CAPACITIVE TOUCH SENSING USING SYSTEM-IN-PACKAGE COMPONENTS AND BATTERIES

BACKGROUND

Electronic devices may include various sensors. Some sensors, such as capacitive touch sensors, may have multiple components that consume physical space within devices. For example, a capacitive touch sensor and associated hardware may be positioned on a circuit board of a device and may therefore cause a footprint of the device to expand. However, devices with compact footprints or reduced thickness may be desired. Accordingly, capacitive touch sensing using system-in-package components and batteries may be desired.

Figure 1:
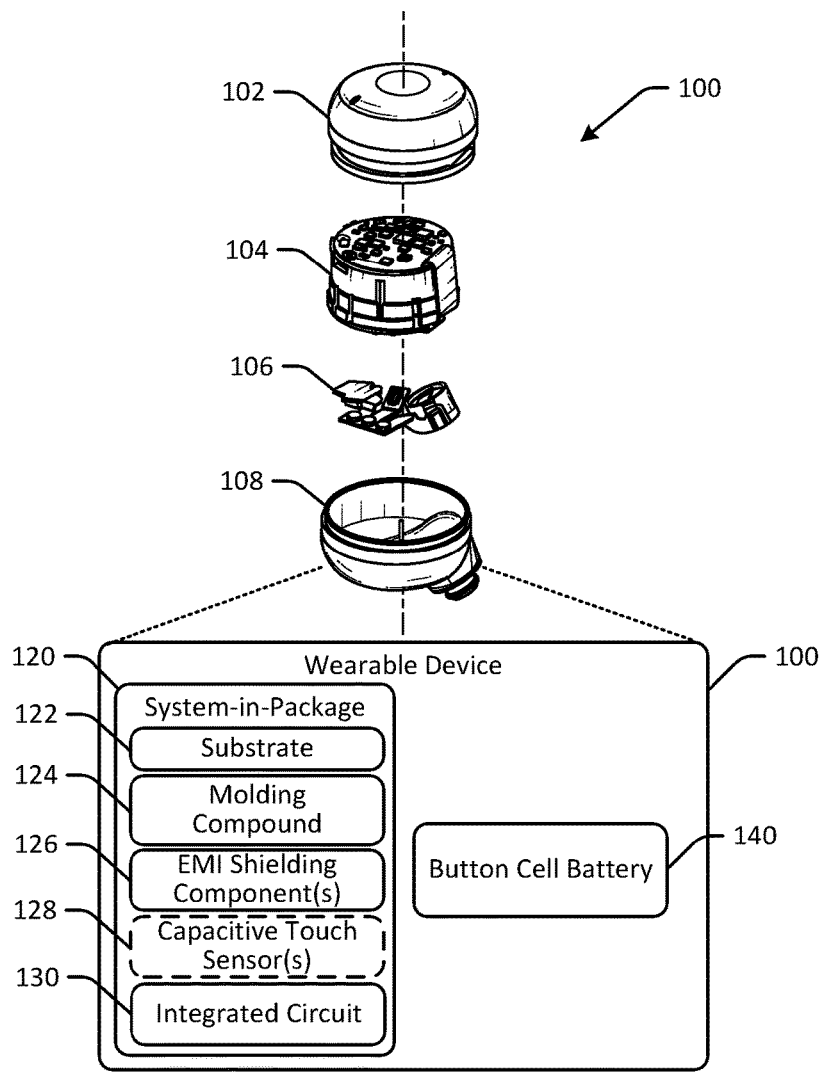
FIG. 1 is a schematic illustration of an example use case of system-in-package components and battery used for capacitive touch sensing in accordance with one or more embodiments of the disclosure.
Figure 1:
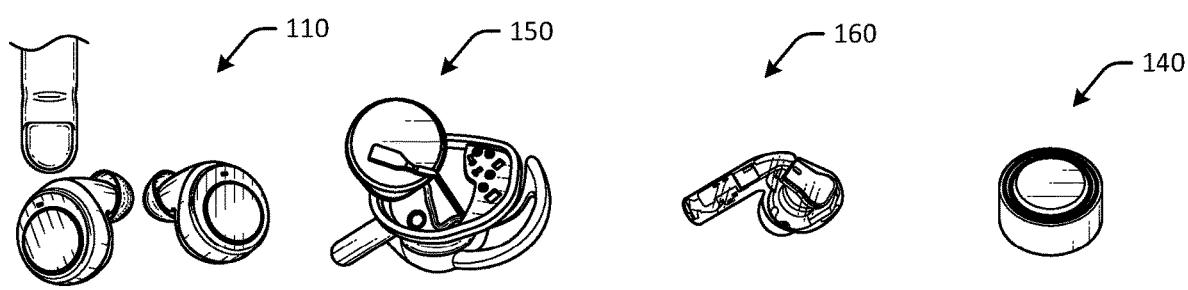

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may use touch sensors, such as capacitive touch sensors, to detect user inputs. For example, a device may include a touchscreen display that users can use to interact with the device. Other devices, such as wearable devices like earbuds, fitness bands, watches, and so forth may also include capacitive touch sensing functionality to detect various inputs by users. Capacitive touch sensors may include a number of components that consume physical space within a device, which may impact not only height and width dimensions of the device, but a thickness of the device as well. For wearable devices, size, shape, and form factor may be important, and more compact sized devices may improve a user experience with the device. Some of the components used in capacitive touch sensors may be used in other components as well, such as certain systems-in-packages, which may result in redundant components, each of which consumes space within the device.

A system-in-package may be a number of integrated circuits and/or other components that are enclosed in one or more chip carrier packages. Some systems-in-packages may include sensors. Systems-in-packages may provide flexibility in electronic device layout, such as by allowing for systems-in-packages to reduce device footprint. In addition, systems-in-packages may be complete functional units that can reduce device complexity.

Embodiments of the disclosure include systems-in-packages that can be used in conjunction with capacitive touch sensors and batteries to avoid redundant components, thereby reducing device footprint, decreasing manufacturing complexity, and reducing device costs. For example, some embodiments include systems-in-packages with an embedded capacitive touch sensor, where an electromagnetic interference shield disposed around an exterior of the system-in-package is used in conjunction with the housing of a battery (such as a button cell battery, a coin battery, a single cell battery, etc.) to detect input at the device via the capacitive touch sensor. As a result, certain standalone components of capacitive touch sensors may not be needed. Other embodiments include different structural designs and components, as discussed herein. Some embodiments use battery cathodes, such as metal cans of button cell batteries, coupled to flexible printed circuits as components for capacitive touch sensing.

In some embodiments, touch sensing functionality for devices can be provided by utilizing an electromagnetic interference coating or shield (e.g., a metal layer, such as a stainless steel layer, a copper layer, etc.) of a system-in-package as part of a capacitive layer of a capacitive touch sensor. Some embodiments may utilize metal battery components, such as part of a battery housing, to provide capacitive touch sensing functionality. Other embodiments may use both the electromagnetic interference shields and the battery components together to provide capacitive touch sensing. Capacitive touch sensing can also be achieved via coupling between the electromagnetic interference shields of a system-in-package and a battery disposed in a stacked arrangement or a horizontal/vertical side-by-side arrangement. As a result, certain embodiments may provide capacitive touch sensing functionality with reduced device footprint, reduced manufacturing complexity, and decreased cost.

Embodiments of the disclosure include capacitive touch sensing using system-in-package components and batteries. Unlike typical systems-in-packages and capacitive touch sensors, certain embodiments may use components of systems-in-packages and components of batteries instead of dedicated capacitive touch sensor components, such as using an electromagnetic interference shield of a system-in-package as part of a capacitive layer of a capacitive touch sensor, along with a battery housing, such as a can of a button cell battery. Embodiments of the disclosure may be used in any suitable electronic device, such as smartphones or other mobile devices, wearables, Internet of Things devices, and the like. In some embodiments, a metal can (which may be an anode or cathode) of a button cell battery can be coupled with a flexible printed circuit by soldering, electrically conductive glue, etc., and then connected to a capacitive touch sensor via a flexible printed circuit trace. Some embodiments may also include antennas, such as radio frequency antennas, and allow for capacitive touch sensing between a system-in-package and an antenna. Antennas can be formed using laser direct structuring, metal sheets, etc. and can be coupled with the flexible printed circuit by soldering, pogo pin or spring contacts, etc. The antenna(s) can then connected to capacitive touch sensor via a flexible printed circuit trace. Some embodiments may allow for capacitive touch sensing between a metal shielding fence (instead of, or in addition to, a system-in-package), a metal can of a button cell battery, and an antenna. The capacitive touch sensor can be assembled inside or outside a system-in-package.

This disclosure relates to, among other things, systems, methods, computer-readable media, techniques, and methodologies for capacitive touch sensing using system-in-package components and batteries. Embodiments may include systems-in-packages and capacitive touch sensors that share components, so as to provide a reduced footprint and improved device durability. Some embodiments may improve performance and increase functionality of systems-in-packages, while potentially reducing propensity for damage.

Referring to FIG. 1, an example use case of a wearable device 100 with system-in-package components and a battery used for capacitive touch sensing is depicted in accordance with one or more embodiments of the disclosure. The wearable device 100 may be any suitable electronic device, such as an earbud, a headphone, a speaker, a fitness band, a smartwatch, a smartphone, an e-reader, a tablet, an audio or video streaming device, an Internet of Things device, a product ordering button or device, a home sensor, an aging in place device, an earphone, a speaker device, or another device. In the example of FIG. 1, the wearable device 100 may be an earbud configured to receive capacitive input. The wearable device 100 may include an outer housing 102 that may have an antenna, a button cell battery carrier 104 that may have a flexible printed circuit assembly and may support a button cell battery 140, a speaker assembly 106, and an inner housing 108.

The wearable device 100 may include one or more systems-in-packages 120. The system-in-package 120 may include a number of components, such as chips, including processors and/or memory, passive components, including resistors and/or capacitors, and/or other components that may be mounted on a substrate 122. In the example of FIG. 1, the substrate 122 may be a circuit board or other substrate. The system-in-package 120 may include additional components, such as a molding compound 124 that at least partially surrounds the components disposed on the substrate 122, one or more optional passive components, such as resistors and/or capacitors, one or more electromagnetic interference shielding components 126, one or more optional capacitive touch sensors 128, and one or more integrated circuits or integrated circuit packages 130. In some embodiments, a capacitive touch sensor 128 may be part of the system-in-package 120, whereas in other embodiments, the capacitive touch sensor 128 may be positioned external to the system-in-package 120. Integrated circuit packages 130 may include one or more components, such as an integrated circuit (which may include a number of semiconductors), and optional sensors. The optional sensors may be any suitable sensor, including, but not limited to, a microphone, a temperature sensor, humidity sensors, a pressure sensor, a camera, an optical sensor, a gas sensor, and/or other sensors or other component, such as a vibration motor.

The molding compound 124 may be disposed on the substrate 122. The molding compound 124 may be any suitable molding compound and may be formed of a material such as a thermosetting material, thermoplastic material, or polymer-based material. Other materials may be used. The molding compound 124 may at least partially surround or otherwise encompass components disposed on the substrate 122. For example, the capacitive touch sensor 128 may be embedded in the molding compound 124, and the integrated circuit package 130 may be partially or fully embedded in the molding compound 124. In other embodiments, an optional semiconductor chip may be embedded in the molding compound 124. The electromagnetic interference shielding component 126 may be disposed around the molding compound 124. For example, the electromagnetic interference shielding component 126 may encompass or encapsulate at least some of the molding compound 124.

The button cell battery 140 may be a coin or other cylindrical type of battery that powers the wearable device 100. The button cell battery 140 may be a rechargeable battery. The button cell battery 140 may be electrically coupled to the system-in-package 120, such as via one or more electrical connections to a flexible printed circuit. In some instances, the button cell battery 140 may have a cathode formed by a cell can or another part of a housing of the button cell battery 140, and an anode formed by a cell top of the button cell battery 140. The cathode and/or anode of the button cell battery 140 may be electrically coupled to a flexible printed circuit.

The wearable device 100 is illustrated in exploded view in FIG. 1 is an example of a device in which capacitive touch sensing can be implemented using system-in-package and battery components. Other embodiments may include different types of wearable devices, such as in-ear headphones 110, over-ear headphones 150, clip-on headphones 160, and so forth.

Accordingly, in one embodiment, the wearable device 100 may include the speaker 106, a microphone, a flexible printed circuit, the button cell battery 140 having a cell can that forms a cathode and a cell top that forms an anode, where the button cell battery 140 is electrically coupled to the flexible printed circuit, and the system-in-package 120 that is electrically coupled to the flexible printed circuit. The system-in-package 120 may include the integrated circuit package 130, the optional capacitive touch sensor 128, the molding compound 124 disposed over the integrated circuit package 130 and the capacitive touch sensor 128, and an electromagnetic interference shield disposed around an outer surface of the molding compound 124. The capacitive touch sensor 128 may be configured to detect a change in capacitance via a change in electric field at the electromagnetic interference shield of the system-in-package 120.

Figure 2A:
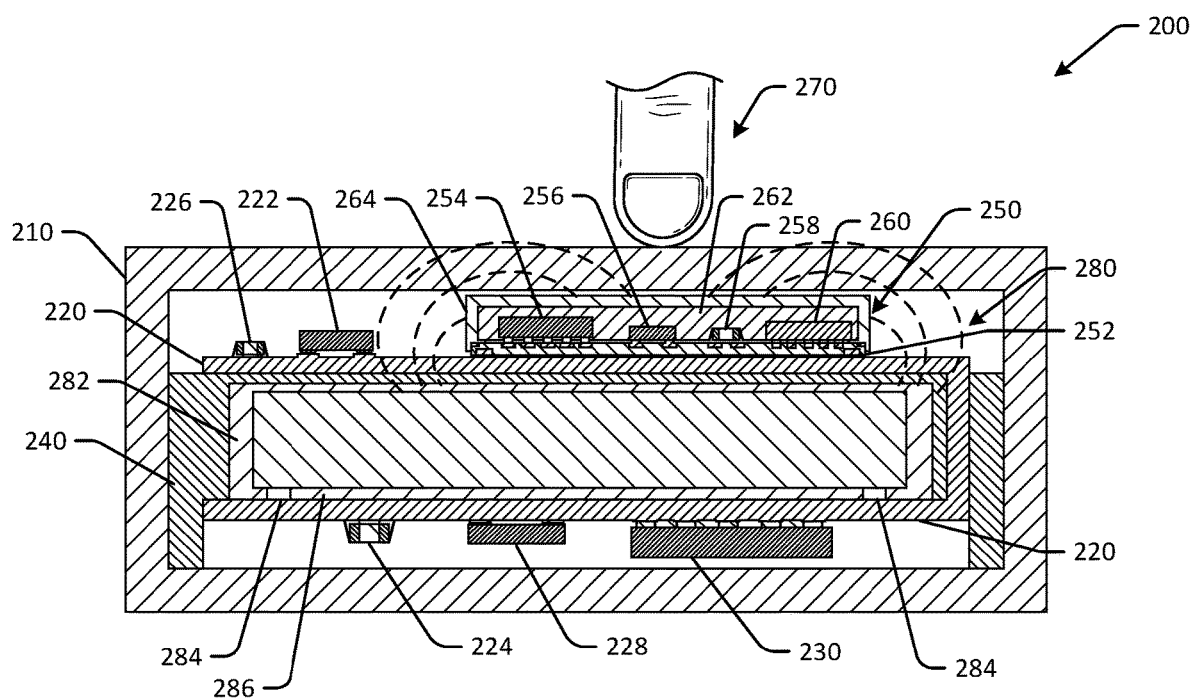
FIGS. 2A-2B are schematic illustrations of various views of an example system-in-package and battery used for capacitive touch sensing in accordance with one or more embodiments of the disclosure.
Figure 2B:
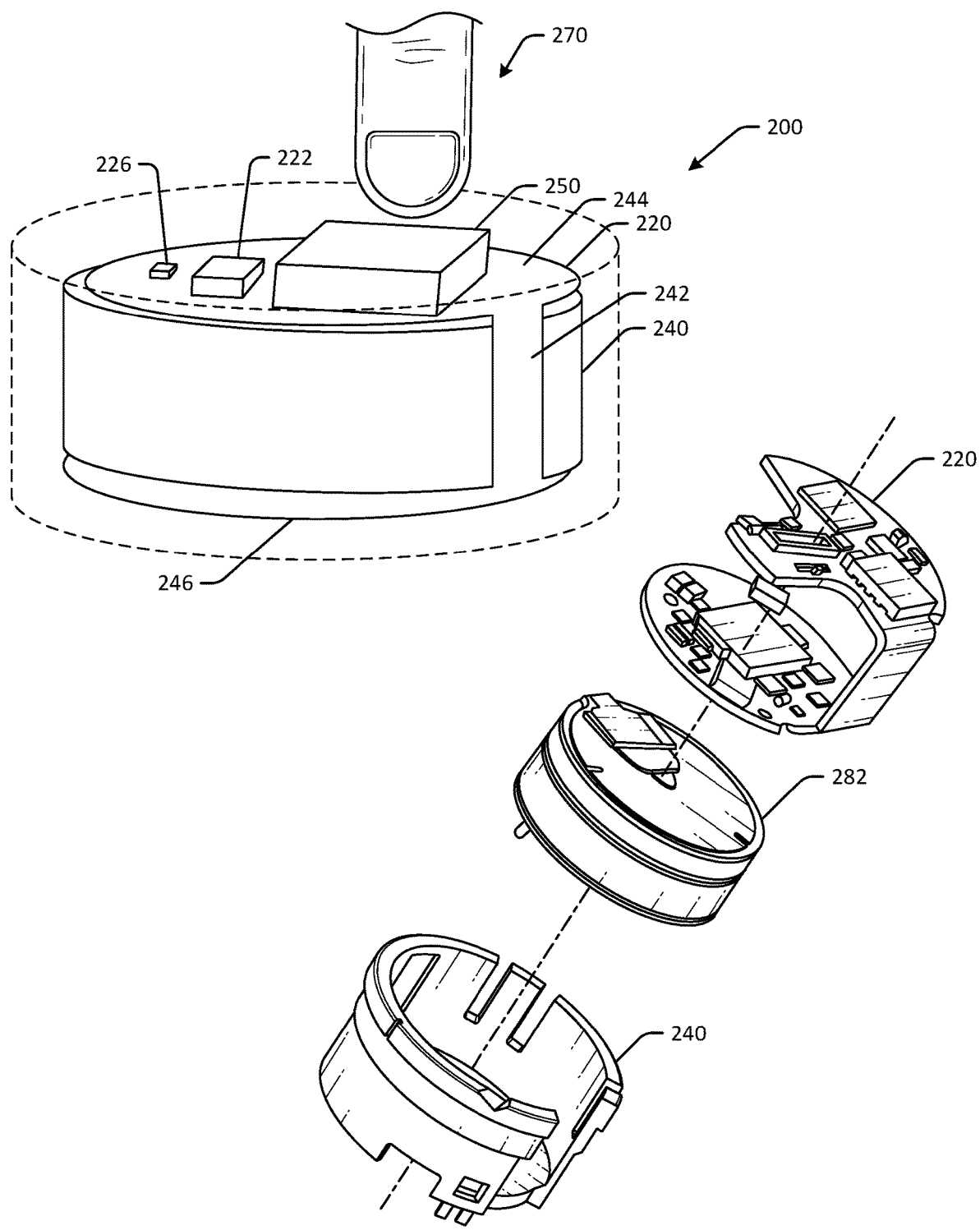

Referring to FIGS. 2A-2B, schematic drawings of various views of an example system-in-package and battery used for capacitive touch sensing are depicted in accordance with one or more embodiments of the disclosure. Other embodiments may include additional or fewer components.

In FIG. 2A, a device 200 is depicted in cross-sectional view. The device 200 may include a housing 210, which may be formed of any suitable material, such as glass, plastic, rubber, composite, or a different type of material. The device 200 may include a flexible printed circuit 220. The flexible printed circuit 220 may be arranged in a planar, flat, or unfolded configuration in some embodiments, or may be arranged in a folded configuration as depicted in FIG. 2A. The flexible printed circuit 220 may include a number of conductive traces bonded on a flexible substrate. A number of components may be disposed on the flexible printed circuit 220.

For example, a prepackaged integrated circuit 230 may be disposed on a first side of the flexible printed circuit 220. A capacitive touch sensor 222 may be disposed on the first side of the flexible printed circuit 220. In some instances, the capacitive touch sensor 222 may be disposed inside a system-in-package (e.g., a capacitive touch sensor 256 in FIG. 2A, etc.) instead of being disposed on the flexible printed circuit 220 as depicted. In some instances, one of the capacitive touch sensor 222 or the capacitive touch sensor 256 may be included instead of both. One or more passive components 226, such as resistors, may be disposed adjacent to the optional capacitive touch sensor 222 (that is external to a system-in-package).

A system-in-package 250 may be disposed on the first side of the flexible printed circuit 220. The system-in-package 250 may be electrically coupled to the flexible printed circuit 220. The system-in-package 250 may include a number of components. For example, the system-in-package 250 may include a substrate 252. The system-in-package 250 may include a first integrated circuit package 254, the optional capacitive touch sensor 256, one or more passive components 258, and one or more optional flip chip integrated circuits 260 positioned on the substrate 252. A flip chip integrated circuit 260 may be used to facilitate connections to other components of a device, such as other semiconductor components. The system-in-package 250 may include a molding compound 262 disposed over the first integrated circuit package 254, the capacitive touch sensor 256, and/or the other components disposed on the substrate 252, such as the one or more passive components 258 and the one or more optional flip chip integrated circuits 260. Accordingly, the components on the substrate 252 may be embedded in the molding compound 262. The molding compound 262 may be formed of a material such as a thermosetting material, thermoplastic material, or polymer-based material. The molding compound 262 may encompass or encapsulate the components of the system-in-package 250 that are disposed on the substrate 252.

The system-in-package 250 may include an electromagnetic interference shield 264 disposed around an outer surface of the molding compound 262. The electromagnetic interference shield 264 may be a fence, coating, or other component formed of a metal material and configured to prevent electromagnetic interference. In some embodiments, the electromagnetic interference shield 264 may be formed of more than one component, while in other embodiments, the electromagnetic interference shield 264 may be a contiguous shield or single piece assembly.

The system-in-package 250 of FIGS. 2A-2B may be similar to the system-in-package 120 of FIG. 1, but depicts a capacitive touch sensor in two different locations. In some embodiments, only one of the two depicted capacitive touch sensors 222, 256 may be included. In other embodiments, both depicted capacitive touch sensors 222, 256 may be included. For example, in some embodiments, the capacitive touch sensor 222 may be included in the device 200, and the capacitive touch sensor 256 may not be included, or the capacitive touch sensor 256 may be included as part of the system-in-package 250, and the capacitive touch sensor 222 may not be included. Positioning of the capacitive touch sensor inside the system-in-package 250 may provide a smaller overall footprint for the assembly, whereas positioning of the capacitive touch sensor outside the system-in-package (or external to the system-in-package) may provide improved system performance due to reduced signal delay (e.g., the signal does not have to travel through the system-in-package components to reach the capacitive touch sensor, etc.).

The device 200 may include a battery carrier 240 configured to support a battery, such as a button cell battery. For example, the battery carrier 240 may include a first side that is flat (e.g., the "top" side on which the flexible printed circuit 220 is disposed in FIG. 2A, etc., where "top" is used to reference relative and not absolute positioning), and a second side that has a recessed portion configured to receive the battery. The battery may have a cell can 282 that may form a cathode of the battery, and a cell top 286 that may form an anode of the battery. The cell top 286 may be insulated from the cell can 282 via an insulating material 284. The cell can 282 may be electrically coupled to the flexible printed circuit 220, and may therefore be in electrical communication with the system-in-package 250. The battery may be coupled to the flexible printed circuit 220 via soldering, electrically conductive glue, a conductive adhesive material, or another coupling mechanism.

The capacitive touch sensor 256 and/or the capacitive touch sensor 222 may be configured to detect a change in capacitance via a change in electric field 280 at the electromagnetic interference shield 264 of the system-in-package 250. For example, as a conductive element 270 comes within proximity to the device 200 or makes contact with the device 200, the capacitive touch sensor 256 and/or the capacitive touch sensor 222 may detect the event as a touch input based at least in part on a change in capacitance. The change in capacitance may be detected based on a change in the electric field 280 at the electromagnetic interference shield 264 of the system-in-package 250. The change in the electric field 280 may be between the electromagnetic interference shield 264 of the system-in-package 250 and the cell can 282 of the battery (or the cell top 286 of the battery in some embodiments).

As depicted in FIG. 2B in perspective view and exploded view, the flexible printed circuit 220 may include a first planar portion 244, a second planar portion 246, and a connector portion 242 that couples the first planar portion 244 to the second planar portion 246. The connector portion 242 may be disposed transverse to the first planar portion 244 and the second planar portion 246. The connector portion 242 may also be planar, or may have another configuration.

The device 200 may therefore include the flexible printed circuit 220, a button cell battery, and the system-in-package 250. The battery may include a cathode and an anode, where the battery is electrically coupled to the flexible printed circuit 220, and where the battery has a cell can that forms the cathode, and a cell top that forms the anode. The system-in-package 250 may be disposed on a first side of the flexible printed circuit 220. The system-in-package 250 may include the molding compound 262 and the electromagnetic interference shield 264, such as an electromagnetic interference fence, an electromagnetic interference shield, an electromagnetic interference coating, or other form of electromagnetic interference component, that is disposed around an outer surface of the molding compound 262. The device 200 may include the capacitive touch sensor (e.g., one or both of capacitive touch sensors 222, 256, etc.). The capacitive touch sensor may be configured to detect a change in capacitance via a change in electric field at the electromagnetic interference shield 264. In some instances, the capacitive touch sensor may be configured to detect a change in capacitance via a change in electric field between the electromagnetic interference shield and the battery.

The device 200 may include the carrier 240, which may be configured to support the battery. The flexible printed circuit 220 may be disposed in a folded configuration about the carrier 240, and the flexible printed circuit 220 may be disposed between the carrier 240 and the system-in-package 250. As depicted in the example of FIG. 2A, the system-in-package 250 and the battery may be arranged in a stacked configuration (e.g., vertically stacked or horizontally stacked, etc.). The carrier 240 may have a first side that is flat and a second side having a recessed portion configured to receive the battery. The flexible printed circuit may be in a folded configuration around the carrier 240, such that the flexible printed circuit 220 is disposed between the system-in-package 250 and the cell can 282 of the battery. The flexible printed circuit 220 in the folded configuration may form a U-shape or partial U-shape geometry. Other folded configurations may be used. In some embodiments, the flexible printed circuit 220 may include one or more joinable portions. In the folded configuration depicted in FIG. 2A, a first side of the flexible printed circuit 220 may be in contact with the first side of the carrier 240, and the first side of the flexible printed circuit 220 may be in contact with the cell top 286 of the battery. The system-in-package 250 and the battery may be in a stacked arrangement. The system-in-package 250 may be coupled to a first side of the flexible printed circuit 220, and the battery may be coupled to a second side of the flexible printed circuit 220. In other embodiments, the system-in-package 250 may be coupled to a first side of the flexible printed circuit 220, and the battery may be coupled to the first side of the flexible printed circuit 220. The device 200 may include the integrated circuit package 230 disposed on the first side of the flexible printed circuit 220, where the system-in-package 250, the battery, and the integrated circuit package 230 are arranged in a stacked configuration.

Example embodiments of the disclosure provide a number of technical features or technical effects. For example, in accordance with example embodiments of the disclosure, certain embodiments of the disclosure may include systems-in-packages with improved functionality, thereby facilitating increased component density and improved performance. Some embodiments may include integrated capacitive touch sensors and systems-in-packages. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

ILLUSTRATIVE EMBODIMENTS AND USE CASES

Figure 3:
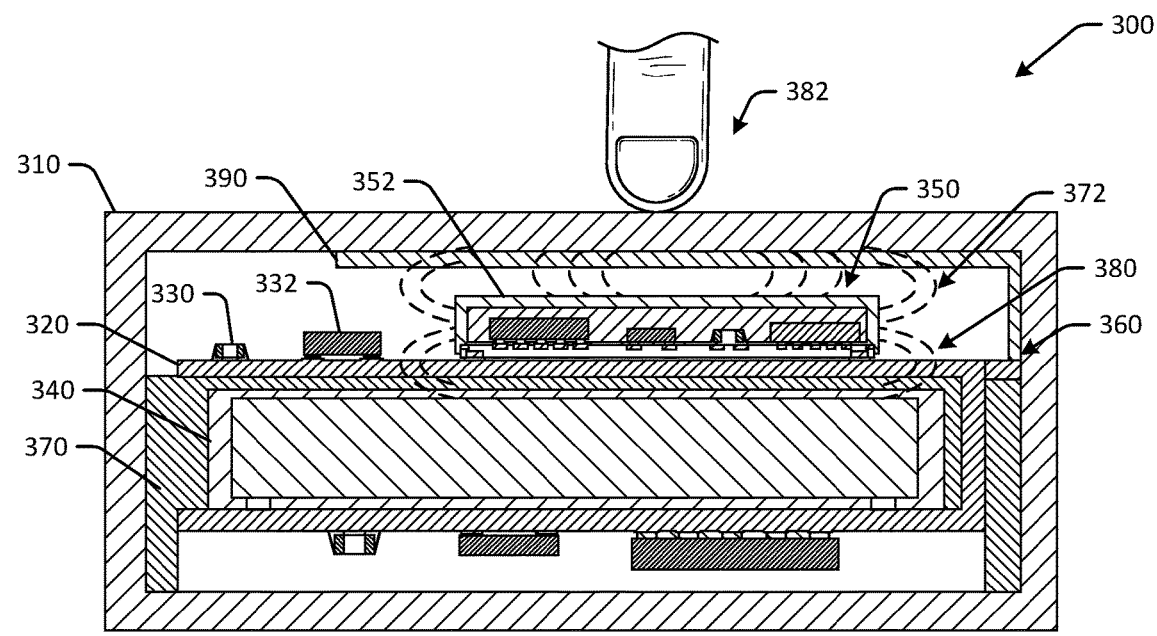
FIG. 3 is a schematic illustration of an example system-in-package and battery used for capacitive touch sensing with an antenna in a stacked arrangement in accordance with one or more embodiments of the disclosure.
Figure 3:
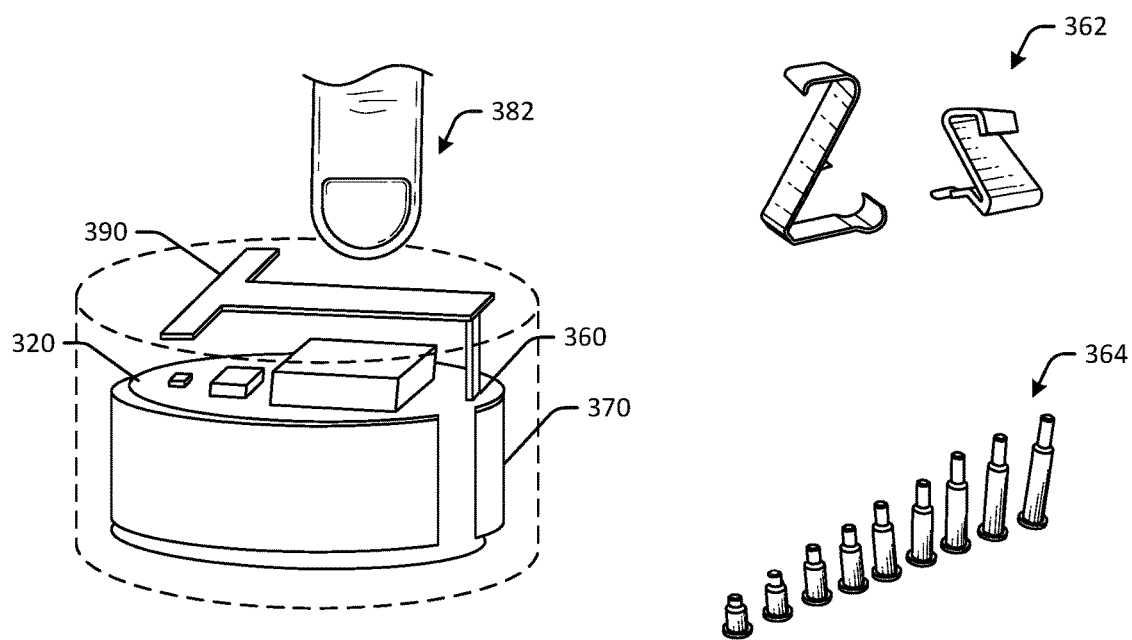

Referring to FIG. 3, a schematic drawing of an example system-in-package and battery used for capacitive touch sensing with an antenna in a stacked arrangement in accordance with one or more embodiments of the disclosure. Other embodiments may include additional or fewer components.

In FIG. 3, a device 300 is depicted in cross-sectional and perspective views, and may be similar to the device 200 of FIGS. 2A-2B, but may include an antenna, such as a radio frequency antenna (e.g. WiFi antenna, Bluetooth antenna, NFC antenna, RFID antenna, etc.). The system-in-package and battery may therefore provide capacitive touch functionality not only adjacent to the system-in-package, but also between the system-in-package and the antenna at an upper side of the device.

The device 300 is depicted in a side cross-sectional view in FIG. 3. The device 300 may include a housing 310, which may be formed of any suitable material, such as glass, plastic, rubber, composite, or a different type of material. The device 300 may include a flexible printed circuit 320. The flexible printed circuit 320 may be arranged in a folded configuration. The flexible printed circuit 320 may include a number of conductive traces bonded on a flexible substrate. A number of components may be disposed on the flexible printed circuit 320.

For example, a system-in-package 350 may be disposed on the flexible printed circuit 320. The system-in-package 350 may be disposed on a first side of the flexible printed circuit 320. The system-in-package 350 may be electrically coupled to the flexible printed circuit 320. The system-in-package 350 may include a number of components. For example, the system-in-package 350 may include a substrate. The system-in-package 350 may include a first integrated circuit package, a capacitive touch sensor, one or more passive components, and one or more optional flip chip integrated circuits positioned on the substrate. A flip chip integrated circuit may be used to facilitate connections to other components of a device, such as other semiconductor components. The system-in-package 350 may include a molding compound disposed over the first integrated circuit package, the capacitive touch sensor, and/or the other components disposed on the substrate, such as the one or more passive components and the one or more optional flip chip integrated circuits. Accordingly, the components on the substrate may be embedded in the molding compound. The molding compound may be formed of a material such as a thermosetting material, thermoplastic material, or polymer-based material. The molding compound may encompass or encapsulate the components of the system-in-package 350 that are disposed on the substrate.

The system-in-package 350 may include an electromagnetic interference shield 352 disposed around an outer surface of the molding compound. The electromagnetic interference shield 352 may be a fence, coating, or other component formed of a metal material and configured to prevent electromagnetic interference. In some embodiments, the electromagnetic interference shield 352 may be formed of more than one component, while in other embodiments, the electromagnetic interference shield 352 may be a contiguous shield or single piece assembly.

The device 300 may include one or more passive components 330 and one or more additional components, such as an optional capacitive touch sensor 332 that is external to the system-in-package 350.

The device 300 may include a battery carrier 370 configured to support a battery 340, such as a button cell battery. For example, the battery carrier 370 may include a first side that is flat, and a second side that has a recessed portion configured to receive the battery 340. The battery 340 may have a cell can that may form a cathode of the battery, and a cell top that may form an anode of the battery. The cell top may be insulated from the cell can via an insulating material. The cell can may be electrically coupled to the flexible printed circuit 320, and may therefore be in electrical communication with the system-in-package 350. The battery 340 may be coupled to the flexible printed circuit 320 via soldering, electrically conductive glue, a conductive adhesive material, or another coupling mechanism.

The device 300 may include an antenna 390. The antenna 390 may be any suitable type of antenna, such as a radio frequency antenna, and may be formed using various methods, such as laser direct structuring, or may be in forms such as a metal sheet, a flexible printed circuit, and so forth. The antenna 390 may be formed of copper, metal, or another material. The antenna 390 may be a WiFi antenna, Bluetooth antenna, NFC antenna, RFID antenna, or another type of antenna. The antenna 390 may be coupled to the flexible printed circuit 320 at an interface 360 using any suitable connection type or coupling method. For example, the interface may include spring contacts on a printed circuit board 362, pogo pins on a printed circuit board 364, and so forth. The antenna 390 may be removably coupled to the flexible printed circuit 320 in some embodiments. The antenna 390 may be electrically coupled to the flexible printed circuit 320, where the antenna 390 can be disposed adjacent to the system-in-package 350, such that the antenna 390, the system-in-package 350, and the battery 340 are in a stacked arrangement. The capacitive touch sensor can be configured to detect a change in capacitance via a change in electric field at the electromagnetic interference shield 352 responsive to presence of a conductive element external to the device adjacent to the antenna 390.

The capacitive touch sensor (internal and/or external to the system-in-package 350) may be configured to detect a change in capacitance via a change in electric field 372 at the electromagnetic interference shield 352 of the system-in-package 350. For example, as a conductive element 382 comes within proximity to the device 300 or makes contact with the device 300, the capacitive touch sensor may detect the event as a touch input based at least in part on a change in capacitance. The change in capacitance may be detected based on a change in the electric field 372 at the electromagnetic interference shield 352 of the system-in-package 350. The change in the electric field 372 may be between the electromagnetic interference shield 352 of the system-in-package 350 and the antenna 390, and also, the capacitive touch sensor may detect a change in an electric field 380 between the electromagnetic interference shield 352 of the system-in-package 350 and the battery 340.

The device 300 may therefore include the flexible printed circuit 320, the battery 340, the system-in-package 350, and the antenna 390. The system-in-package 350 may include the molding compound and the electromagnetic interference shield 352, such as an electromagnetic interference fence, an electromagnetic interference shield, an electromagnetic interference coating, or other form of electromagnetic interference component, that is disposed around an outer surface of the molding compound. The device 300 may include the capacitive touch sensor (e.g., one or both of capacitive touch sensors, etc.). The capacitive touch sensor may be configured to detect a change in capacitance via a change in electric field at the electromagnetic interference shield 352. In some instances, the capacitive touch sensor may be configured to detect a change in capacitance via a change in electric field between the electromagnetic interference shield 352 and the battery 340, and/or via a change in electric field between the electromagnetic interference shield 352 and the antenna 390.

Accordingly, the embodiment of the device 300 depicted in the example of FIG. 3 may provide additional touch sensing functionality than otherwise available with the antenna 390. In some embodiments, the capacitive touch sensor of the system-in-package 350 may be configured to detect a change in capacitance via a respective change in electric field at the electromagnetic interference shield of the system-in-package 350.

Figure 4:
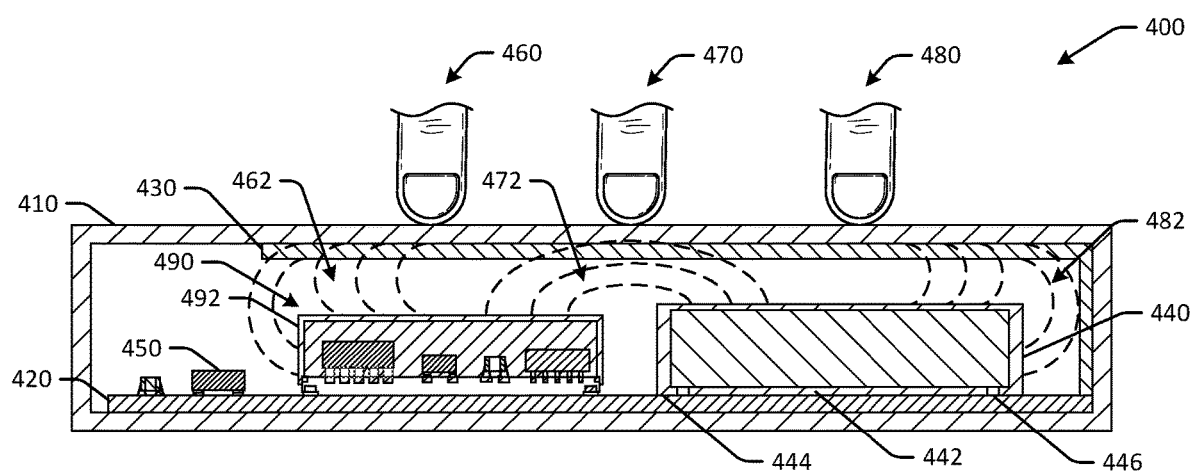
FIG. 4 is a schematic illustration of an example system-in-package and battery used for capacitive touch sensing with an antenna in a horizontal arrangement in accordance with one or more embodiments of the disclosure.

FIG. 4 is a schematic illustration of an example system-in-package and battery used for capacitive touch sensing with an antenna in a horizontal arrangement in accordance with one or more embodiments of the disclosure. Other embodiments may include additional or fewer components.

The system-in-package of FIG. 4 may be similar to the system-in-package 200 of FIGS. 2A-2B and system-in-package of FIG. 3, but may include a flexible printed circuit that is in an unfolded or planar configuration instead of a folded configuration. The components disposed on the flexible printed circuit may therefore be in a side-by-side arrangement. The embodiments may nonetheless provide touch sensing functionality via use of the electromagnetic interference shields and battery components of the device.

A device 400 having a system-in-package 490 is illustrated in a side cross-sectional view in FIG. 4. The device 400 may include a housing 410, which may be formed of any suitable material, such as glass, plastic, rubber, composite, or a different type of material. The housing 410 may have any suitable configuration.

The device 400 may include a flexible printed circuit 420. The flexible printed circuit 420 may be arranged in a planar or unfolded configuration. For example, the flexible printed circuit 420 may be disposed on a flat surface of the housing 410. The flexible printed circuit 420 may include a number of conductive traces bonded on a flexible substrate. A number of components may be disposed on the flexible printed circuit 420.

For example, the system-in-package 490 may be disposed on the flexible printed circuit 420. The system-in-package 490 may be disposed on a first side of the flexible printed circuit 420. The system-in-package 490 may be electrically coupled to the flexible printed circuit 420. The system-in-package 490 may include a number of components. For example, the system-in-package 490 may include a substrate. The system-in-package 490 may include a first integrated circuit package, a capacitive touch sensor, one or more passive components, and one or more optional flip chip integrated circuits positioned on the substrate. A flip chip integrated circuit may be used to facilitate connections to other components of a device, such as other semiconductor components. The system-in-package 490 may include a molding compound disposed over the first integrated circuit package, the capacitive touch sensor, and/or the other components disposed on the substrate, such as the one or more passive components and the one or more optional flip chip integrated circuits. Accordingly, the components on the substrate may be embedded in the molding compound. The molding compound may be formed of a material such as a thermosetting material, thermoplastic material, or polymer-based material. The molding compound may encompass or encapsulate the components of the system-in-package 490 that are disposed on the substrate.

The system-in-package 490 may include an electromagnetic interference shield 492 disposed around an outer surface of the molding compound. The electromagnetic interference shield 492 may be a fence, coating, or other component formed of a metal material and configured to prevent electromagnetic interference. In some embodiments, the electromagnetic interference shield 492 may be formed of more than one component, while in other embodiments, the electromagnetic interference shield 492 may be a contiguous shield or single piece assembly.

The device 400 may include additional components 450 disposed on the first side of the flexible printed circuit 420 (e.g., adjacent to the system-in-package 490, etc.). The additional components 450 may be one or more of passive components, capacitive touch sensors, integrated circuits, flip chips, and/or other components. The additional components 450 may include a passive component that is disposed on the first side of the flexible printed circuit 420.

The device 400 may include a battery 440, such as a button cell battery. The battery 440 may have a cell can 444 that may form a cathode of the battery 440, and a cell top 442 that may form an anode of the battery 440. The cell top 442 may be insulated from the cell can 444 via an insulating material 446. The cell can 444 may be electrically coupled to the flexible printed circuit 420, and may therefore be in electrical communication with the system-in-package 490. The battery 440 may be coupled to the flexible printed circuit 420 via soldering, electrically conductive glue, a conductive adhesive material, or another coupling mechanism.

The device 400 may include an antenna 430, such as a radio frequency antenna (e.g. WiFi antenna, Bluetooth antenna, NFC antenna, RFID antenna, etc.). The antenna 430 may be any suitable type of antenna, such as a radio frequency antenna, and may be formed using various methods, such as laser direct structuring, or may be in forms such as a metal sheet, a flexible printed circuit, and so forth. The antenna 430 may be formed of copper, metal, or another material. The antenna 430 may be a WiFi antenna, Bluetooth antenna, NFC antenna, RFID antenna, or another type of antenna. The antenna 430 may be coupled to the flexible printed circuit 420 using any suitable connection type or coupling method. For example, the interface may include spring contacts on a printed circuit board, pogo pins on a printed circuit board, and so forth. The antenna 430 may be removably coupled to the flexible printed circuit 420 in some embodiments. The antenna 430 may be electrically coupled to the flexible printed circuit 420, where the antenna 430 can be disposed adjacent to the system-in-package 490 and the battery 440, such that the antenna 430 is vertically aligned with the system-in-package 490 and the battery 440 (whereas the system-in-package 490 and the battery 440 are in a side-by-side arrangement). The capacitive touch sensor can be configured to detect a change in capacitance via a change in electric field at the electromagnetic interference shield 492 responsive to presence of a conductive element external to the device adjacent to the antenna 430.

The capacitive touch sensor (internal and/or external to the system-in-package 490) may be configured to detect a change in capacitance via a change in electric field 462 at the electromagnetic interference shield 492 of the system-in-package 490. For example, as a conductive element 460 comes within proximity to the device 400 or makes contact with the device 400 near the antenna 430 and the electromagnetic interference shield 492, the capacitive touch sensor may detect the event as a touch input based at least in part on a change in capacitance. The change in capacitance may be detected based on a change in the electric field 462 at the electromagnetic interference shield 492 of the system-in-package 490. The change in the electric field 462 may be between the electromagnetic interference shield 492 of the system-in-package 490 and the antenna 430, and also, the capacitive touch sensor may detect a change in an electric field 472 between the electromagnetic interference shield 492 of the system-in-package 490 and the battery 440 (e.g. the cell can 444 of the battery 440, etc.). Accordingly, as a conductive element 470 comes within proximity to the device 400 or makes contact with the device 400 at or near a point between the electromagnetic interference shield 492 and the battery 440, the capacitive touch sensor may detect the event as a touch input based at least in part on a change in capacitance. Further, the capacitive touch sensor may detect a change in an electric field 482 between the antenna 430 and the battery 440 (e.g. the cell can 444 of the battery 440, etc.). Accordingly, as a conductive element 480 comes within proximity to the device 400 or makes contact with the device 400 near the antenna 430 and the battery 440, the capacitive touch sensor may detect the event as a touch input based at least in part on a change in capacitance.

The system-in-package and battery may therefore provide capacitive touch functionality not only adjacent to the system-in-package, but also between the system-in-package and the antenna, and the antenna and battery at an upper side of the device. Accordingly, the embodiment of the device 400 depicted in the example of FIG. 4 may provide additional touch sensing functionality than otherwise available with the antenna 430. In some embodiments, the capacitive touch sensor of the system-in-package 490 may be configured to detect a change in capacitance via a respective change in electric field at the electromagnetic interference shield of the system-in-package 490.

Figure 5:
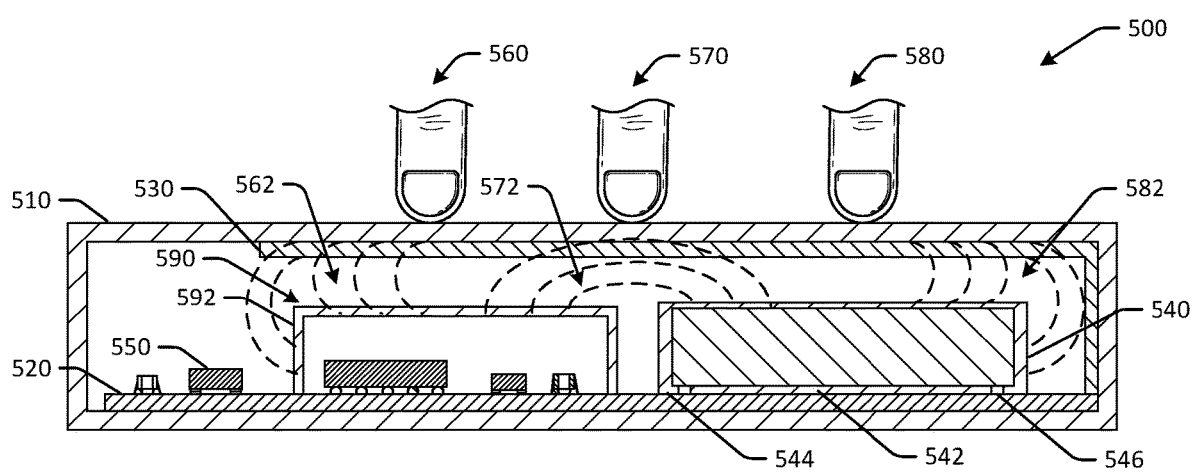
FIG. 5 is a schematic illustration of an example metal shielding fence and battery used for capacitive touch sensing with an antenna in a horizontal arrangement in accordance with one or more embodiments of the disclosure.

FIG. 5 is a schematic illustration of an example metal shielding fence and battery used for capacitive touch sensing with an antenna in a horizontal arrangement in accordance with one or more embodiments of the disclosure. Other embodiments may include additional or fewer components.

The embodiment of the device 500 of FIG. 5 may be similar to the embodiment of FIG. 4, but may include a metal shielding 592 disposed adjacent to a portion having a shield fence 590. The portion having the shield fence 590 may not include the molding compound and instead may include a number of components coupled to a flexible circuit board 520.

The device 500 is depicted in a side cross-sectional view in FIG. 5. The device 500 may include a housing 510, which may be formed of any suitable material, such as glass, plastic, rubber, composite, or a different type of material. The housing 510 may have any suitable configuration.

The device 500 may include a flexible printed circuit 520. The flexible printed circuit 520 may be arranged in a planar or unfolded configuration. For example, the flexible printed circuit 520 may be disposed on a flat surface of the housing 510. The flexible printed circuit 520 may include a number of conductive traces bonded on a flexible substrate. A number of components may be disposed on the flexible printed circuit 520.

For example, the portion having the shield fence 590 may be disposed on the flexible printed circuit 520. The portion having the shield fence 590 may be disposed on a first side of the flexible printed circuit 520. The portion having the shield fence 590 may be electrically coupled to the flexible printed circuit 520. The portion having the shield fence 590 may include a number of components. For example, the portion having the shield fence 590 may include a first integrated circuit package, a capacitive touch sensor, one or more passive components, and one or more optional flip chip integrated circuits positioned on the substrate. A flip chip integrated circuit may be used to facilitate connections to other components of a device, such as other semiconductor components.

The portion having the shield fence 590 or its components may be at least partially surrounded by the metal shielding 592. The metal shielding 592 may be a fence, coating, or other component formed of a metal material and configured to prevent electromagnetic interference. In some embodiments, the metal shielding 592 may be formed of more than one component, while in other embodiments, the metal shielding 592 may be a contiguous shield or single piece assembly.

The device 500 may include additional components 550 disposed on the first side of the flexible printed circuit 520 (e.g., adjacent to the portion having the shield fence 590, etc.). The additional components 550 may be one or more of passive components, capacitive touch sensors, integrated circuits, flip chips, and/or other components. The additional components 550 may include a passive component that is disposed on the first side of the flexible printed circuit 520.

The device 500 may include a battery 540, such as a button cell battery. The battery 540 may have a cell can 544 that may form a cathode of the battery 540, and a cell top 542 that may form an anode of the battery 540. The cell top 542 may be insulated from the cell can 544 via an insulating material 546. The cell can 544 may be electrically coupled to the flexible printed circuit 520, and may therefore be in electrical communication with the portion having the shield fence 590. The battery 540 may be coupled to the flexible printed circuit 520 via soldering, electrically conductive glue, a conductive adhesive material, or another coupling mechanism.

The device 500 may include an antenna 530, such as a radio frequency antenna (e.g. WiFi antenna, Bluetooth antenna, NFC antenna, RFID antenna, etc.). The antenna 530 may be any suitable type of antenna, such as a radio frequency antenna, and may be formed using various methods, such as laser direct structuring, or may be in forms such as a metal sheet, a flexible printed circuit, and so forth. The antenna 530 may be formed of copper, metal, or another material. The antenna 530 may be a WiFi antenna, Bluetooth antenna, NFC antenna, RFID antenna, or another type of antenna. The antenna 530 may be coupled to the flexible printed circuit 520 using any suitable connection type or coupling method. For example, the interface may include spring contacts on a printed circuit board, pogo pins on a printed circuit board, and so forth. The antenna 530 may be removably coupled to the flexible printed circuit 520 in some embodiments. The antenna 530 may be electrically coupled to the flexible printed circuit 520, where the antenna 530 can be disposed adjacent to the portion having the shield fence 590 and the battery 540, such that the antenna 530 is vertically aligned with the portion having the shield fence 590 and the battery 540 (whereas the portion having the shield fence 590 and the battery 540 are in a side-by-side arrangement). The capacitive touch sensor can be configured to detect a change in capacitance via a change in electric field at the metal shielding 592 responsive to presence of a conductive element external to the device adjacent to the antenna 530.

The capacitive touch sensor (internal and/or external to the portion having the shield fence 590) may be configured to detect a change in capacitance via a change in electric field 562 at the metal shielding 592. For example, as a conductive element 560 comes within proximity to the device 500 or makes contact with the device 500 near the antenna 530 and the metal shielding 592, the capacitive touch sensor may detect the event as a touch input based at least in part on a change in capacitance. The change in capacitance may be detected based on a change in the electric field 562 at the metal shielding 592. The change in the electric field 562 may be between the metal shielding 592 and the antenna 530, and also, the capacitive touch sensor may detect a change in an electric field 572 between the metal shielding 592 and the battery 540 (e.g. the cell can 544 of the battery 540, etc.). Accordingly, as a conductive element 570 comes within proximity to the device 500 or makes contact with the device 500 at or near a point between the metal shielding 592 and the battery 540, the capacitive touch sensor may detect the event as a touch input based at least in part on a change in capacitance. Further, the capacitive touch sensor may detect a change in an electric field 582 between the antenna 530 and the battery 540 (e.g. the cell can 544 of the battery 540, etc.). Accordingly, as a conductive element 580 comes within proximity to the device 500 or makes contact with the device 500 near the antenna 530 and the battery 540, the capacitive touch sensor may detect the event as a touch input based at least in part on a change in capacitance.

The portion having the shield fence and battery may therefore provide capacitive touch functionality not only adjacent to the metal shielding 592, but also between the metal shielding 592 and the antenna, and the antenna and battery at an upper side of the device. Accordingly, the embodiment of the device 500 depicted in the example of FIG. 5 may provide additional touch sensing functionality than otherwise available with the antenna 530. In some embodiments, the capacitive touch sensor of the portion having the shield fence 590 may be configured to detect a change in capacitance via a respective change in electric field at the electromagnetic interference shield of the portion having the shield fence 590.

Accordingly, an embodiment may include a device having a flexible printed circuit, a button cell battery having a cathode and an anode, and the portion having the shield fence electrically coupled to the flexible printed circuit. The portion having the shield fence may include a capacitive touch sensor, and the device may include a metal shielding fence disposed about the capacitive touch sensor, where the capacitive touch sensor is configured to detect a change in capacitance via a change in electric field at the metal shielding fence. The device may include an antenna electrically coupled to the flexible printed circuit, where the capacitive touch sensor is configured to detect a change in capacitance via a change in electric field between the metal shielding fence and the antenna. The flexible printed circuit may be in a planar configuration, and the button cell battery and the portion having the shield fence may be in a side-by-side configuration. The capacitive touch sensor may be configured to detect a change in capacitance via a change in electric field between the antenna and the button cell battery. The capacitive touch sensor may be configured to detect a change in capacitance via a change in electric field between the metal shielding fence and the button cell battery.

One or more operations of the methods, process flows, or use cases of FIGS. 1-5 may have been described above as being performed by a user device, or more specifically, by one or more program module(s), applications, or the like executing on a device. It should be appreciated, however, that any of the operations of the methods, process flows, or use cases of FIGS. 1-5 may be performed, at least in part, in a distributed manner by one or more other devices, or more specifically, by one or more program module(s), applications, or the like executing on such devices (where appropriate). In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-5 may be described in the context of the illustrative devices, it should be appreciated that such operations may be implemented in connection with numerous other device configurations.

The operations described and depicted in the illustrative methods, process flows, or use cases of FIGS. 1-5 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Example Device Architecture

Figure 6:
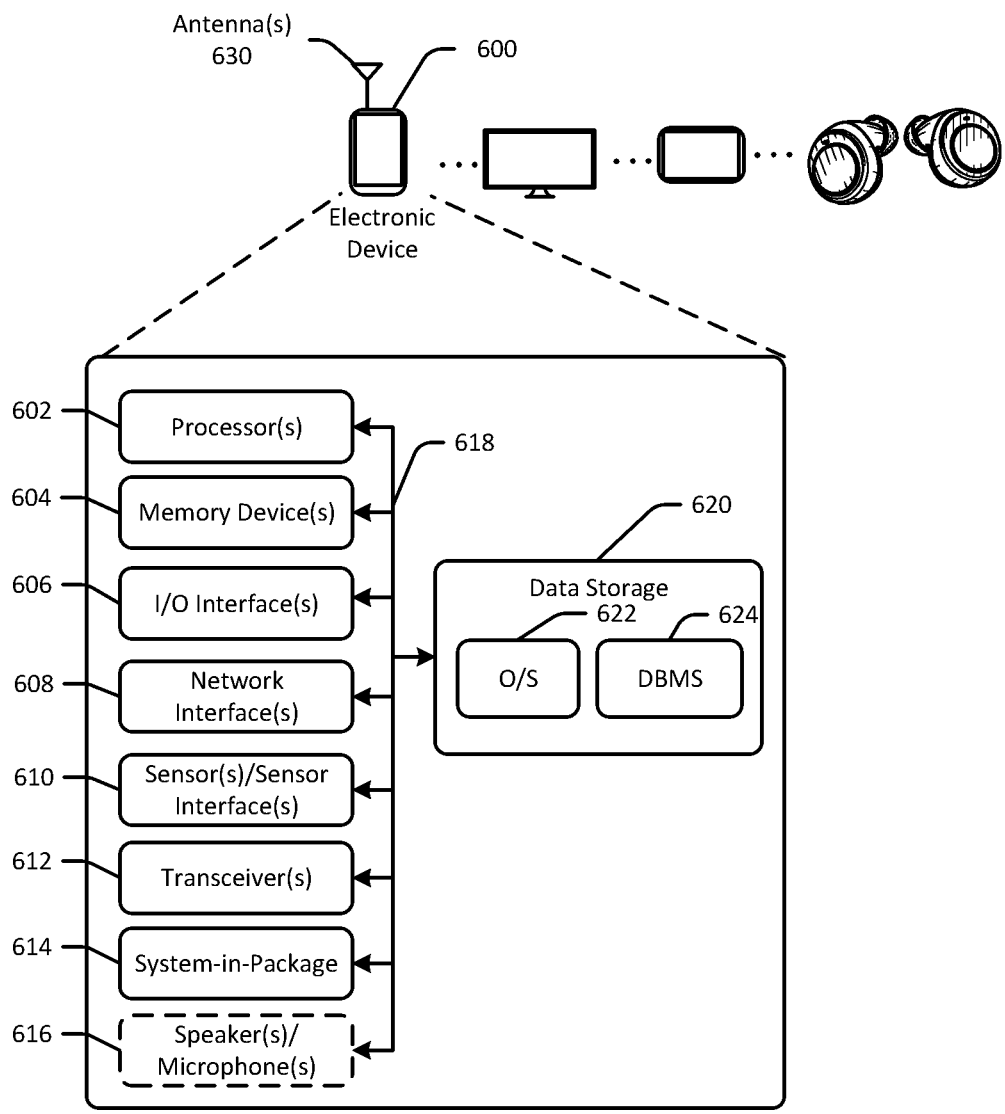
FIG. 6 schematically illustrates an example architecture of an electronic device in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable computing device including, but not limited to, a server system, a voice interaction device, a mobile device such as a smartphone, a tablet, an e-reader, a wearable device, or the like; a desktop computer; a laptop computer; a content streaming device; or the like. The electronic device(s) 600 may correspond to an illustrative device configuration for the device(s) that includes one or more of the system(s)-in-package(s) of FIGS. 1-5.

The electronic device(s) 600 may be configured to communicate with one or more servers, user devices, or the like. The electronic device(s) 600 may be configured to be coupled to one or more batteries, such as a button cell battery. The electronic device(s) 600 may be configured to use a system(s)-in-package(s) to determine one or more capacitive touch inputs and/or related actions at the device.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610, one or more transceiver(s) 612, one or more system(s)-in-package(s) 614, one or more optional microphone(s) 616, and data storage 620. The electronic device(s) 600 may further include one or more bus(es) 618 that functionally couple various components of the electronic device(s) 600. The electronic device(s) 600 may further include one or more antenna(s) 630 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s) 600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device (s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), FireWire, Thunderbolt, Ethernet port or other connection protocol that may connect to one or more networks. The I/O interface(s) 606 may also include a connection to one or more of the antenna(s) 630 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(s) 630 may include any suitable type of antenna depending, for example, on the communications protocols used to transmit or receive signals via the antenna (s) 630. Non-limiting examples of suitable antennas may include directional antennas, non-directional antennas, dipole antennas, folded dipole antennas, patch antennas, multiple-input multiple-output (MIMO) antennas, or the like. The antenna(s) 630 may be communicatively coupled to one or more transceivers 612 or radio components to which or from which signals may be transmitted or received.

As previously described, the antenna(s) 630 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 630 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHZ channels (e.g., 802.11n, 802.11ac), or 60 GHz channels (e.g., 802.11 ad). In alternative example embodiments, the antenna(s) 630 may be configured to transmit or receive radio frequency signals within any suitable frequency range forming part of the unlicensed portion of the radio spectrum.

The antenna(s) 630 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(s) 630—transmitting or receiving radio frequency (RF) signals in the bandwidth and/or channels corresponding to the communications protocols utilized by the electronic device (s) 600 to communicate with other devices. The transceiver (s) 612 may include hardware, software, and/or firmware for modulating, transmitting, or receiving-potentially in cooperation with any of antenna(s) 630—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver (s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The system(s)-in-package(s) 614 may be any of the system(s)-in-package(s) described herein, and may include sensor(s) configured to determine characteristics of an ambient environment, to capture images, to output audio, and/or other functions. The system(s)-in-package(s) 614 may be coupled to a battery or other components, such as those described in conjunction with FIGS. 1-5. The optional speaker(s)/microphone(s) 616 may be any device configured to receive analog sound input or voice data.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG.

6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A wearable device comprising:
   a speaker;
   a microphone;
   a flexible printed circuit;
   a button cell battery that is electrically coupled to the flexible printed circuit; and
   a system-in-package electrically coupled to the flexible printed circuit, the system-in-package comprising:
     an integrated circuit unit;
     a capacitive touch sensor;
     a molding compound disposed over the integrated circuit unit and the capacitive touch sensor; and
     an electromagnetic interference shield disposed around an outer surface of the molding compound;
   wherein the capacitive touch sensor is configured to detect a change in capacitance via a change in electric field at the electromagnetic interference shield of the system-in-package.

2. The wearable device of claim 1, further comprising:
   a battery carrier configured to support the button cell battery, the battery carrier comprising a first side that is flat and a second side having a recessed portion configured to receive the button cell battery;
   wherein the flexible printed circuit is in a folded configuration around the battery carrier, such that the flexible printed circuit is disposed between the system-in-package and a first side of the button cell battery, and a first side of the flexible printed circuit is in contact with the first side of the battery carrier, and the first side of the flexible printed circuit is in contact with a second side of the button cell battery; and
   wherein the system-in-package and the button cell battery are in a stacked arrangement.

3. The wearable device of claim 1, further comprising:
   an antenna electrically coupled to the flexible printed circuit, wherein the antenna is disposed adjacent to the system-in-package, such that the antenna, the system-in-package, and the button cell battery are in a stacked arrangement;
   wherein the capacitive touch sensor is configured to detect a change in capacitance via a change in electric field at the electromagnetic interference shield responsive to the presence of a conductive element external to the device and proximate to the antenna.

4. The wearable device of claim 1, further comprising:
   an antenna electrically coupled to the flexible printed circuit;
   wherein the flexible printed circuit is in a planar configuration, and the button cell battery and the system-in-package are disposed in a side-by-side arrangement on a same side of the flexible printed circuit; and
   wherein the capacitive touch sensor is configured to detect a change in capacitance via a change in electric field at the electromagnetic interference shield responsive to the presence of a conductive element external to the device and proximate to the antenna.

5. A device comprising:
   a flexible printed circuit;
   a button cell battery electrically coupled to the flexible printed circuit; and
   a system-in-package electrically coupled to the flexible printed circuit, the system-in-package comprising:
     an electromagnetic interference shield; and
     a capacitive touch sensor;
   wherein the capacitive touch sensor is configured to detect a change in capacitance via a change in electric field at the electromagnetic interference shield.

6. The device of claim 5, further comprising:
   a carrier configured to support the button cell battery;
   wherein the flexible printed circuit is disposed in a folded configuration about the carrier, and wherein the flexible printed circuit is disposed between the carrier and the system-in-package, and the system-in-package and the button cell battery are arranged in a stacked configuration.

7. The device of claim 5, wherein the system-in-package is coupled to a first side of the flexible printed circuit, and the button cell battery is coupled to a second side of the flexible printed circuit.

8. The device of claim 7, further comprising:
   an integrated circuit unit disposed on the first side of the flexible printed circuit;
   wherein the system-in-package, the button cell battery, and the integrated circuit unit are arranged in a vertically stacked configuration.

9. The device of claim 5, wherein the flexible printed circuit comprises:
   a first planar portion;
   a second planar portion; and
   a connector portion that couples the first planar portion to the second planar portion.

10. The device of claim 5, further comprising:
    an antenna electrically coupled to the flexible printed circuit;
    wherein the capacitive touch sensor is configured to detect a change in capacitance via a change in electric field between the electromagnetic interference shield and the antenna.

11. The device of claim 10, wherein the flexible printed circuit is in a planar configuration, and the button cell battery and the system-in-package are in a side-by-side configuration.

12. The device of claim 11, wherein the capacitive touch sensor is configured to detect a change in capacitance via a change in electric field between the antenna and the button cell battery.

13. The device of claim 5, wherein the capacitive touch sensor is configured to detect a change in capacitance via a change in electric field between the electromagnetic interference shield and the button cell battery.

14. The device of claim 5, wherein the system-in-package further comprises:
a molding compound;
wherein the capacitive touch sensor is embedded in the molding compound.

15. A device comprising:
a flexible printed circuit;
a button cell battery electrically coupled to the flexible printed circuit; and
a portion having a shield fence disposed on the flexible printed circuit, the portion comprising a capacitive touch sensor, wherein the shield fence is disposed about the capacitive touch sensor;
wherein the capacitive touch sensor is configured to detect a change in capacitance via a change in electric field at the shield fence.

16. The device of claim 15, further comprising:
an antenna electrically coupled to the flexible printed circuit;
wherein the capacitive touch sensor is configured to detect a change in capacitance via a change in electric field between the shield fence and the antenna.

17. The device of claim 15, wherein the flexible printed circuit is in a planar configuration, and the button cell battery and the portion having the shield fence are in a side-by-side configuration.

18. The device of claim 17, wherein the capacitive touch sensor is configured to detect a change in capacitance via a change in electric field between the antenna and the button cell battery.

19. The device of claim 15, wherein the capacitive touch sensor is configured to detect a change in capacitance via a change in electric field between the shield fence and the button cell battery.

20. The device of claim 15, wherein the button cell battery comprises a cell top that is in contact with the flexible printed circuit.

* * * * *